United States Patent [19]
Yang et al.

[11] Patent Number: 6,130,462
[45] Date of Patent: Oct. 10, 2000

[54] VERTICAL POLY LOAD DEVICE IN 4T SRAM TECHNOLOGY

[75] Inventors: Ching-Nan Yang, Hsinchu; Chia-Chen Liu, Hsinchu Hsien, both of Taiwan

[73] Assignee: Worldwide Semiconductor Manufacturing Corp., Hsinchu, Taiwan

[21] Appl. No.: 09/360,809

[22] Filed: Jul. 26, 1999

[51] Int. Cl.[7] ................................ H01L 29/76
[52] U.S. Cl. ............... 257/379; 257/380; 257/907; 257/904; 257/902; 257/903; 438/238; 438/382
[58] Field of Search ................. 257/379, 380, 257/907, 964, 902, 903; 438/238, 382

[56] References Cited

U.S. PATENT DOCUMENTS

| | | | |
|---|---|---|---|
| 5,330,930 | 7/1994 | Chi | 437/60 |
| 5,885,862 | 3/1999 | Jao et al. | 438/238 |
| 5,907,175 | 5/1999 | Klein | 257/379 |
| 5,907,176 | 5/1999 | Roberts | 257/379 |
| 5,986,310 | 11/1999 | Peng | 257/379 |
| 5,986,922 | 11/1999 | Perumal | 365/154 |
| 5,998,276 | 12/1999 | Batra et al. | 438/382 |
| 6,008,082 | 12/1999 | Rolfson | 438/238 |

*Primary Examiner*—Mathew S. Smith
*Assistant Examiner*—Belur Keshavan

[57] ABSTRACT

A novel vertical poly load device in 4T SRAM and a method for fabricating the same are disclosed. The poly load structure is a vertical device formed on a buried contact. The poly load vertical device is constructed by forming a hollow in a planarized dielectric layer with a high temperature oxide layer on the walls of the hollow and with lightly doped n-type polysilicon in the hollow. The poly load is connected to the respective drain of the driver transistor through the buried contact and to the gate of the respective gate of the other driver transistor through a connecting line. The resistance of the poly load will increase, as the voltage of the buried contact becomes low thereby reducing the standby current.

7 Claims, 12 Drawing Sheets

VERTICAL POLY LOAD DEVICE IN 4T SRAM TECHNOLOGY

FIELD OF THE INVENTION

The present invention relates to a semiconductor memory process, and more specifically, to a vertical poly load structure for the static random access memory (SRAM). In this poly load structure, the resistance of the poly load will increase as it is at a low potential state, thus reduces the stand-by current.

BACKGROUND OF THE INVENTION

Static RAMs (SRAM) are fast, low power and easier to use in the microprocessor system since they are unlikely that operates in dynamic RAMs, they require no refresh circuit. Hence SRAMs are often preferred as main memory in high performance small system, where their inherently high speed permits operation without a cache. Further, their low standby power, are used extensively for battery back up and in battery operated power. Furthermore, in the field of personal computer, the SRAM cells serve as the cache memory to reduce the number of wait states with the system processor.

FIG. 1 shows a conventional four-transistor and two-poly-load SRAM cell 5 having two access transistors 11 and 12 which connect respective nodes N1 and N2 to respective bit lines 21 and 22. The poly loads 31 and 32 and transistors 41 and 42 control the voltages on nodes N1 and N2. The poly loads 31 and 32 are between respective nodes N1 and N2 and a supply voltage $V_{CC}$. The transistors 41 and 42 are between respective nodes N1 and N2 and ground (reference voltage VSS) and have gate cross-coupled to opposite nodes N2 and N1, respectively.

In the steady state, the voltages on nodes N1 and N2 are complementary. Voltage on node N1 being high turns on transistor 42, which pull down node N2 low. When the voltage on node N2 is low, transistor 41 is off so that the node N1 is high. Thus a bit data is latched or say stored in SRAM cell 5. During a write cycle, a gate voltage on word line 10 turns on the access transistor 11 and 12. A low voltage asserted the bit line 21 switches the voltage levels on the latch and as a consequence can switch the state of the cell.

It is noted that the stand-by current $I_1$ and $I_2$ will keep, however, at certain current level i.e. $I_1=(V_{CC}-V_{DS})/R_1$, and $I_2=(V_{CC}-V_{TH})/R_2$, for the situation that the transistor 42 turns on, but the transistor 41 turns off. Hence, for the purpose of further reduce the current consumption, it is required to increase the resistance of poly loads, but it will cause the instability issue for retaining the data in the cell. A high performance poly load to resolve above issue, therefore, is sought.

SUMMARY OF THE INVENTION

The invention provides a novel vertical poly load structure and a method for fabricating simultaneously a vertical poly load, an access transistor and a driver transistor in a SRAM cell. The method comprises following steps: at first, a semiconductor substrate having a first device and a second device regions. Each one of the device regions is isolated by isolation regions. After forming a gate oxide layer, the gate oxide is patterned to define a buried contact. A polysilicon layer and a tungsten silicide layer are then sequentially formed on all regions and patterned to form a gate for the driver transistor, a buried contact, and a gate for the access transistor. The gate of the driver transistor also connects to the buried contact. Thereafter, a LDD implant and a spacer formation are followed to form LDD regions and sidewall spacers. Subsequently, a source/drain implant is performed to form the devices. A first interpoly dielectric layer IPD1 is then formed to insulating them. A contact hole to contact the gate of driver transistor is then defined by lithographic technique and etching process. After a second polysilicon layer formed on all regions and filled in the contact hole, the second polysilicon layer is patterned to form a connection line connecting the poly load to the gate of the driver transistor. After depositing an IPD2 (second interpoly dielectric layer) on all regions, a hollow is then formed therein to contact the buried contact. Subsequently, a HTO (high temperature oxide layer) using a LPCVD method formed on the sidewall of the hollow is achieved. Then an undoped silicon layer formed on all areas and refilled the hollow is done. After etching back, a lightly ion implant using n-type conductive impurities is carried out to doped the undoped silicon layer. Subsequently, a third doped polysilicon layer is deposited on all regions and patterned so that a connection line is formed to connect the poly load body to a voltage supplied electrode. Thereafter, an IPD3 deposited on all areas and via formations to respective contact a source/drain of the driver transistor and a source/drain of pass-gate transistor are performed.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DETAILED DESCRIPTION OF THE PREFERRED EMBODIMENT

As forgoing depicted in the background of invention, the standby current consumption and the stored data retention are a trade-off issue since the poly load manufactured by the conventional method is difficult to adjust appropriately to the required value. The present invention provides a method to resolve above issues.

Figure 1:
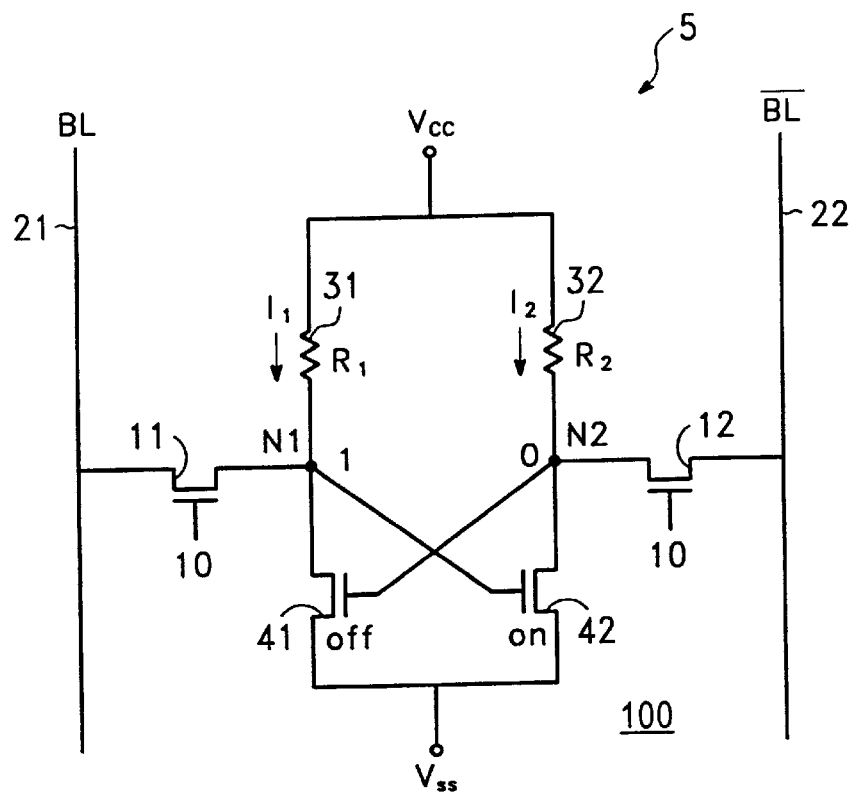
FIG. 1 is a schematic SRAM circuit in accordance with the prior art
Figure 2:
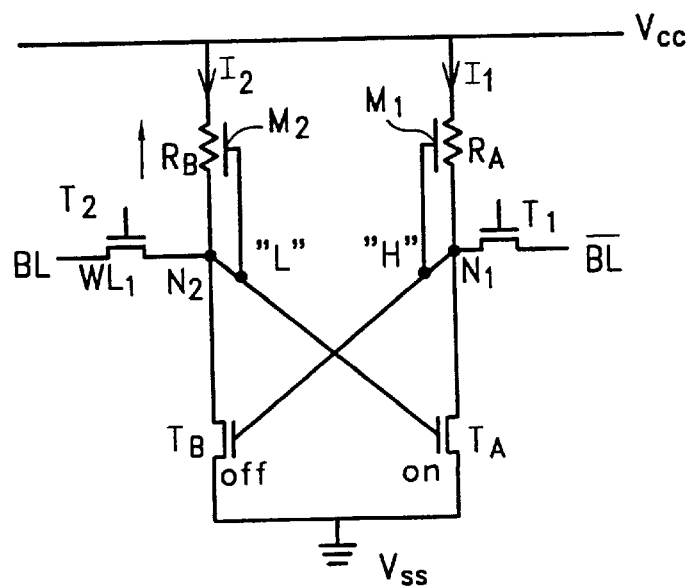
FIG. 2 is a schematic SRAM circuit in accordance with the present invention.

Referring to FIG. 2, a schematic circuit of a SRAM cell is shown. Similar to the circuitry shown in the FIG. 1, there is a SRAM cell 100 with four transistors (i.e. access transistors, $T_1$ and $T_2$ and driver transistors $T_A$ and $T_B$) but two poly-loads (i.e. $R_A$ and $R_B$) have a novel structure. The poly loads $R_A$ and $R_B$ are vertical devices which connect between respect nodes N1 and N2, and a supply voltage $V_{CC}$, and have terminals M1 and M2 using inter-connection line connect poly loads to nodes N1 and N2, respectively. Each poly load is constructed in a hollow (shown later in FIGS. 8–11) which is with an oxide layer on the sidewall, a buried contact at the bottom, and a lightly n-type doped polysilicon layer in remaining portion. A n-type doped polysilicon layer patterned as conductive lines couples the poly loads to the $V_{CC}$. The driver transistors $T_A$ and $T_B$ are between respective nodes N1 and N2 and ground (reference voltage $V_{SS}$) and have gates cross-coupled to opposite nodes N2 and N1, respectively. Two access transistors $T_1$ and $T_2$ connect respective nodes N1 and N2 to respective bit lines 71 and 72.

In the cell, assume a bit data is latched so that the voltage of node N1 is at a high state and the Node N2 is at low state. When the voltage of node N2 is low, the depletion region (please also see FIG. 13 for the detailed description) will appear along the sidewall of the poly load $R_B$ so that the resistance of $R_B$ hence, increases, as a consequence, the stand-by current $I_2$ decreases. That is the standby current consumption is reduced. However, the positive bias applied to the other poly-load $R_A$ does not affect its resistance. Hence, the data retention is not influenced since $I_1$ does not decrease concurrently.

Figure 3:
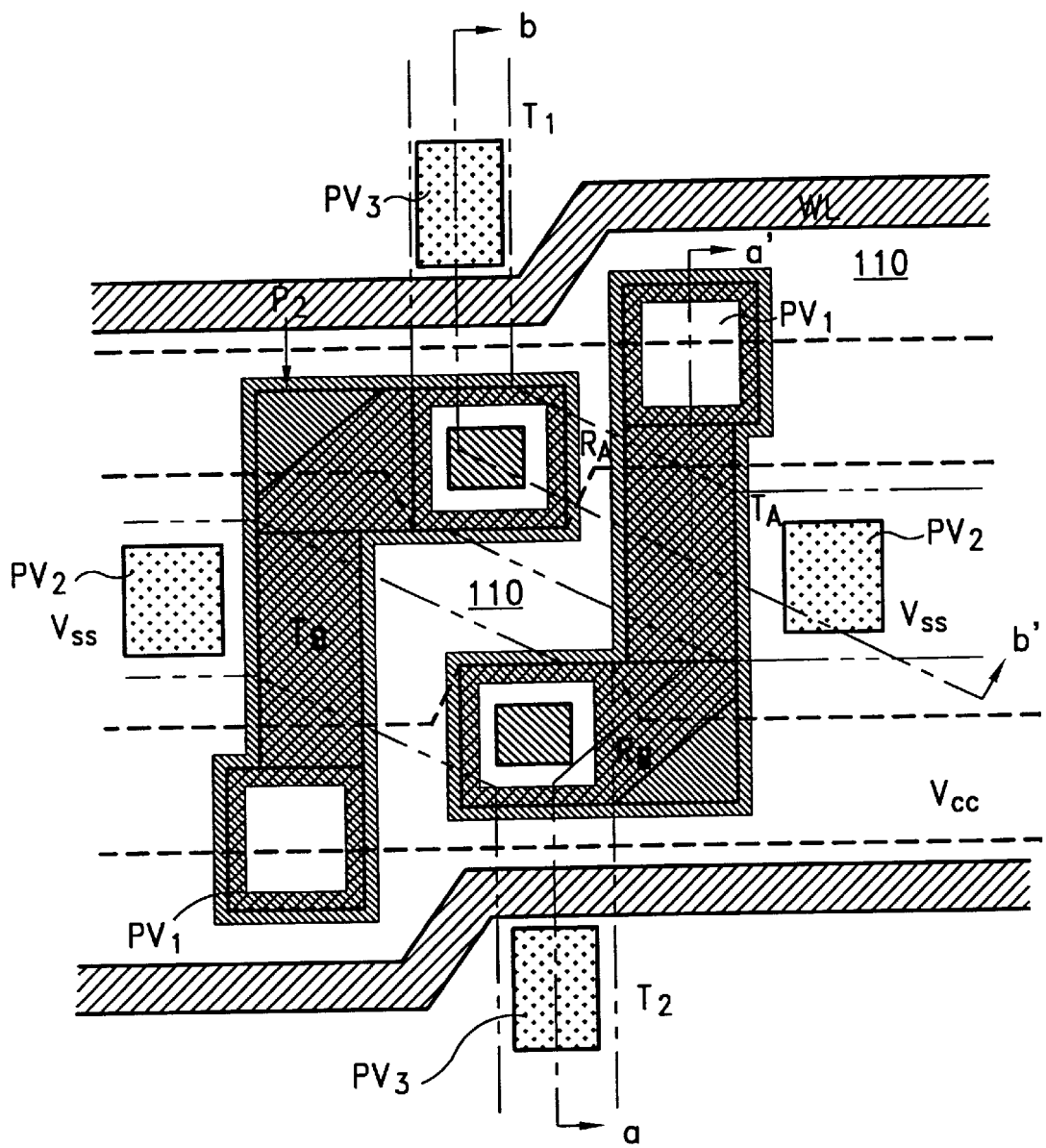
FIG. 3 is a layout of SRAM cell in accordance with the present invention.

The method SRAM cell with high performance poly loads will depict as follows:

FIG. 3 shows a top view of a split-word-line SRAM cell 100 with four transistors and two poly loads formed in accordance with a preferred embodiment of the invention. In the figure, multi-polysilicon layers are shown. FIG. 4 to FIG. 12, are cross-sectional views along broken lines a-a' or b-b', which will describe concurrently with FIG. 3, to describe the SRAM cell during manufacturing. Noted that the split-word-line SRAM cell is a symmetry cell and therefor, only the portions of SRAM cell indicated by broken lines a-a', and b-b' are depicted, the other portion of the cell will not be depicted.

Figure 4A:
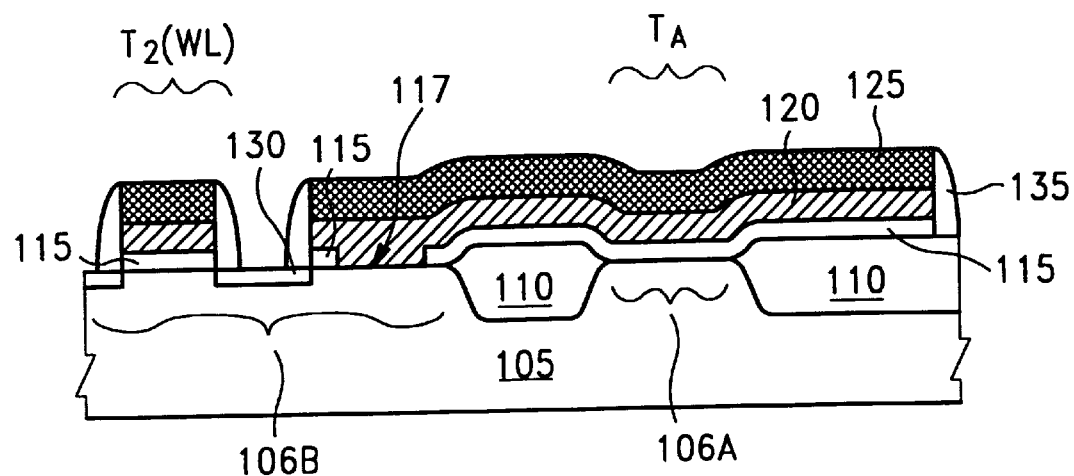
FIG. 4A and FIG. 4B are cross-sectional views along a broken line a-a' and a broken line b-b', respectively, in FIG. 3 for forming buried contact, a driver transistor, and an access transistor during manufacturing of SRAM cell in accordance with the present invention.
Figure 4B:
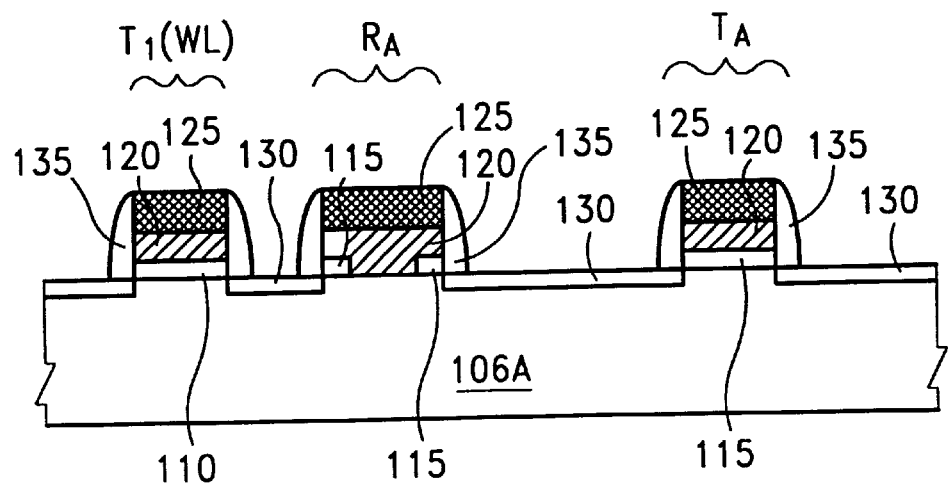

Referring now to FIGS. 4A and 4B are cross-sectional views along broken lines, a-a' and b-b', respectively, the SRAM cell process begins by forming isolation regions 110 around the device areas 106A and 106B on a semiconductor substrate 105. Preferably, the isolation regions 110 are field oxide regions (FOX) by a conventional LOCOS process. The substrate 105 is typically a single crystal silicon substrate doped with boron.

After forming the field oxide 110, the substrate 105 is thermally oxidized to form a gate oxide 115. The gate oxide 115 is preferably grown to a thickness of between about 5–7 nm. Then, after defining buried contact regions 117, a blanket first polysilicon layer 120 of between 100–300 nm is then deposited on all areas by a low pressure chemical vapor deposition (LPCVD) method. The first polysilicon layer 120 is doped with n-type impurities, for example, by ion implantation or alternatively by an in-situ doping with arsenic or phosphorus. A metal silicide layer 125 of between about 100–300 nm is formed on the polysilicon layer 120 to reduce the gate electrode resistance. Preferably, the metal silicide is selected from refractory metal silicide, such as WSix, TiSi2, CoSi2, and so on and formed by CVD method. After that, a lithographic technique and an anisotropic plasma etching are conducted to pattern the metal silicide layer 125 and the polysilicon layer 120. As a consequence, as shown in FIG. 4A, the gate electrodes for the access transistor $T_2$, and a gate electrode for the driver transistor $T_A$ are formed. The gate electrode of $T_A$ is extended across the isolation region 110 to the buried contact 117 in the active region 106B, which serves as a bottom layer of a poly load $R_B$. Further, as shown in FIG. 4B, gates of transistors $T_1$, and $T_A$ and another buried contact $R_A$ are also formed in the active region 106A.

Still referring to FIG. 4A and FIG. 4B, after a lightly doped drain (LDD) ion implant to form LDD region 130, a spacer formation to form spacers 135 on sidewalls of the gate electrodes are achieved. Preferably, the dosage and energy for ion implant are between about $1 \times 10^{13}$–$5 \times 10^{13}$/$cm^2$ and 30–60 keV, respectively. The ion species are n-type conductive ions such as $As^+$ or $P^+$. The spacer formation is done by forming oxide layer (or nitride layer) (not shown) followed by an anisotropic etching technique to form oxide spacers (or nitride spacer) 135.

Figure 5A:
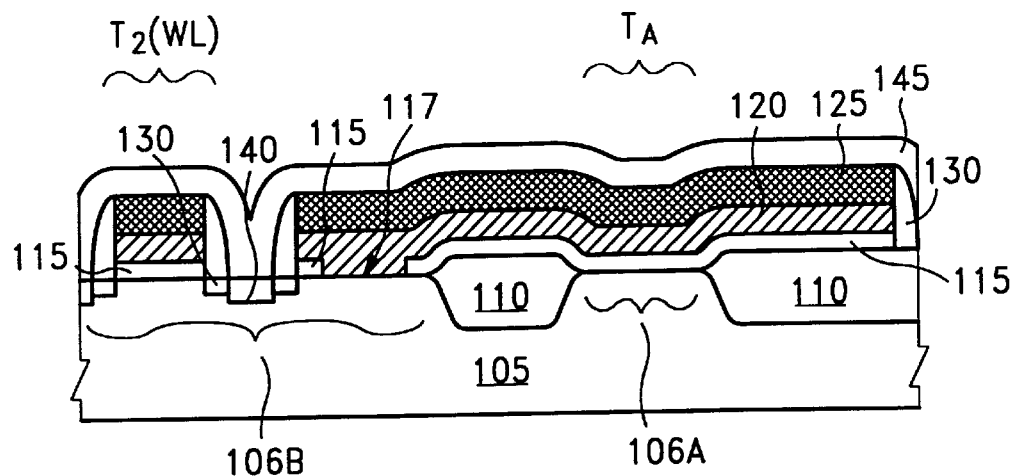
FIG. 5A and FIG. 5B are cross-sectional views along a broken line a-a' and a line broken b-b', respectively, in FIG. 3 in which source/drain implant and IPD1 deposition are performed.
Figure 5B:
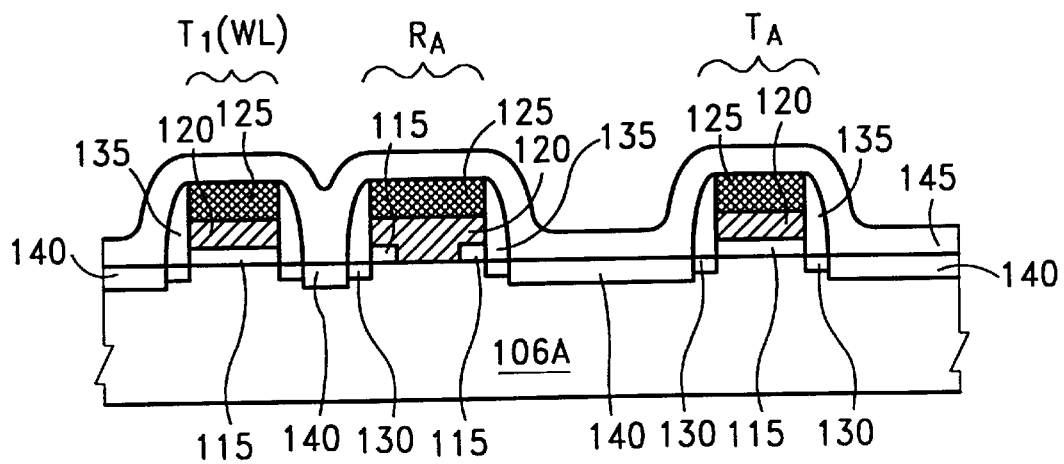

Referring to FIGS. 5A and 5B, subsequently, a source/drain (S/D) implant into semiconductor substrate 105 is performed to form source/drain regions 140. A first interpoly dielectric layer (IPD1) 145 is deposited on the transistors, buried contact 125 and elsewhere on the substrate 105. The IPD1 145 is preferably a silicon oxide layer, such as $O_3$ TEOS formed under low deposition temperature of between about 350–550° C. or deposited at a temperature of between about 500–800° C. using LPCVD and a TEOS gas to a thickness of between about 100–300 nm. Typically, the IPD1 145 is between about 150 nm in thickness.

Figure 6:
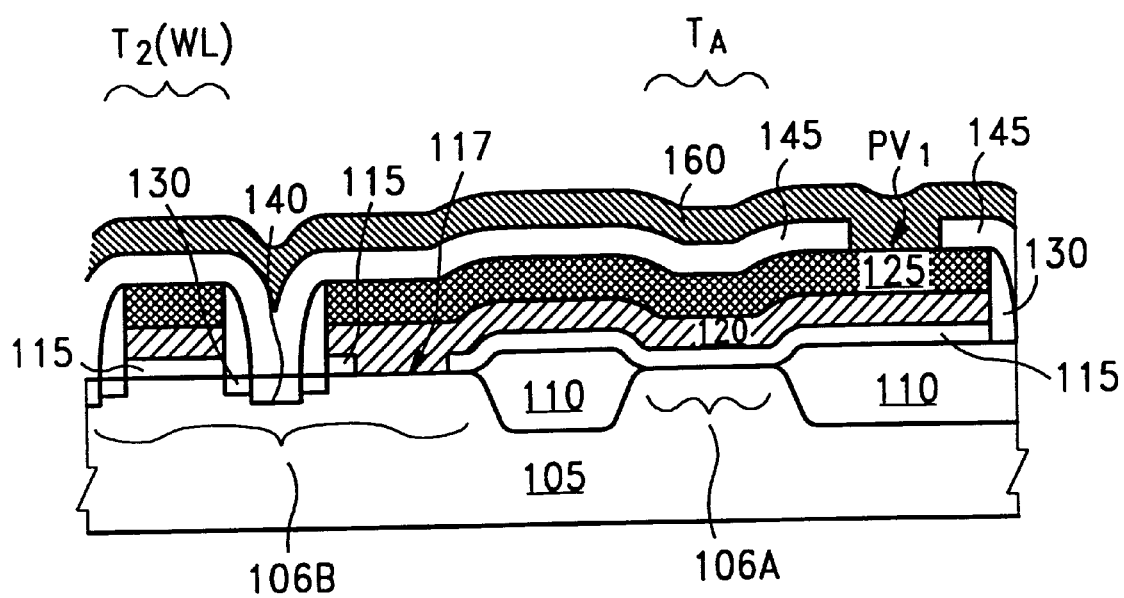
FIG. 6 is a cross-sectional view along a broken line a-a' in FIG. 3, in which gate contact hole definition, and second polysilicon layer deposition are sequentially done in accordance with the present invention.

FIG. 6, a cross-sectional view along a broken line b-b' is shown. For forming interconnecting lines, a photoresist pattern (not shown) and an anisotropic etching are sequential performed to define a gate contact hole PV1 on the gate electrode of the driver transistor $T_A$. After strip the photoresist pattern, a second polysilicon layer 160 deposition is followed to refilled the gate contact hole PV1 and elsewhere on the IPD1 145. The second polysilicon layer 160 is deposited by LPCVD in-situ doped with n-type conductive impurities. The thickness of second polysilicon layer 160 is between about 100–300 nm.

Figure 7A:
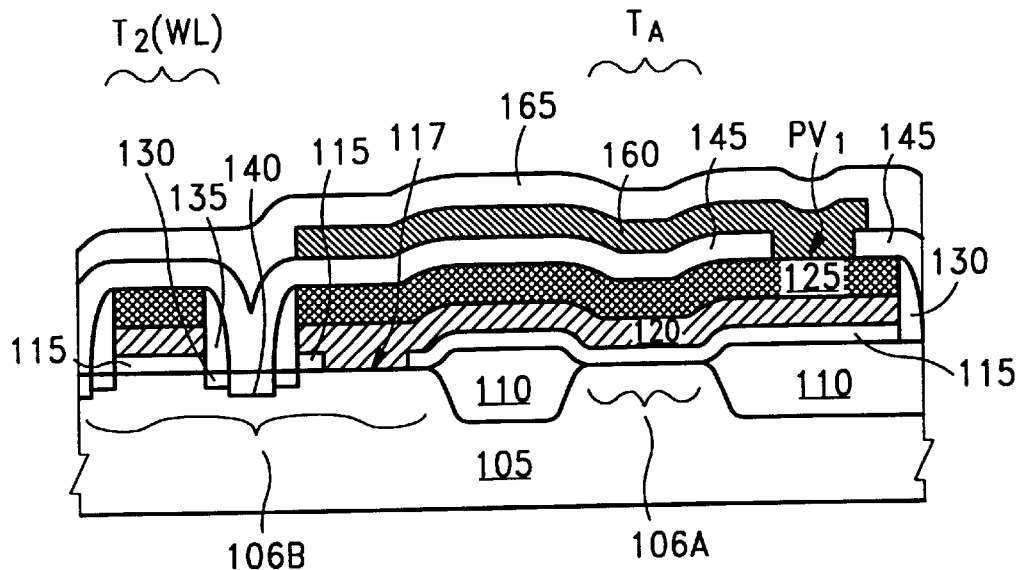
FIG. 7A and FIG. 7B are cross-sectional views along a broken line a-a' and a broken line b-b', respectively, in FIG. 3, in which the vertical poly load device area is defined in accordance with the present invention.
Figure 7B:
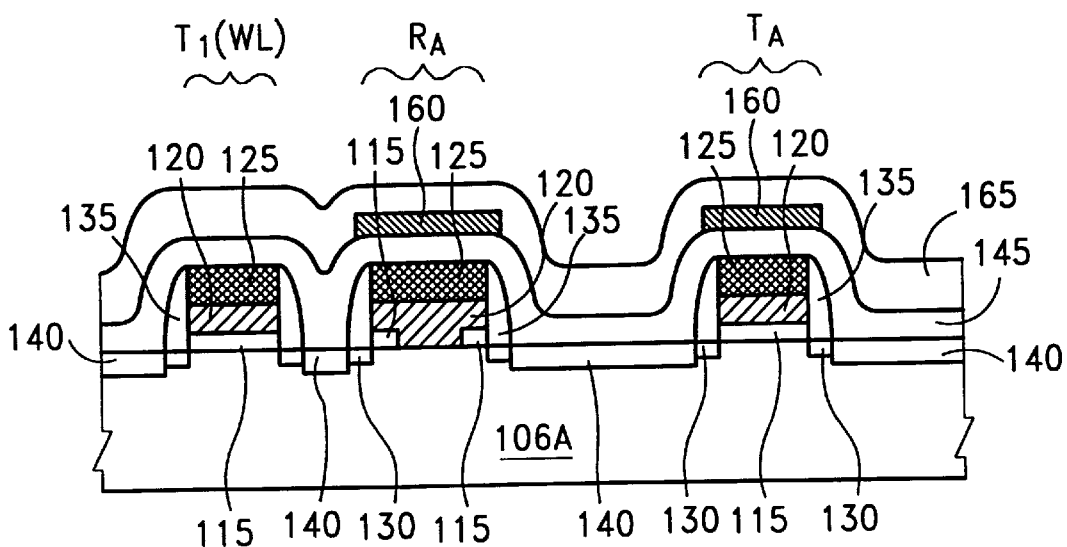

Referring now to FIGS. 7A and 7B, the second polysilicon layer 160 is patterned to connect the driver transistor, such as a transistor $T_A$, to the poly load $R_B$. Subsequently, a second interpoly dielectric (IPD2) 165 is deposited on the second polysilicon layer 160 and elsewhere on the IPD1 145. The deposition method and the material for IPD2 165 are the same as the IPD1 145. The thickness of IPD2 165 is between about 100–300 nm.

Figure 8A:
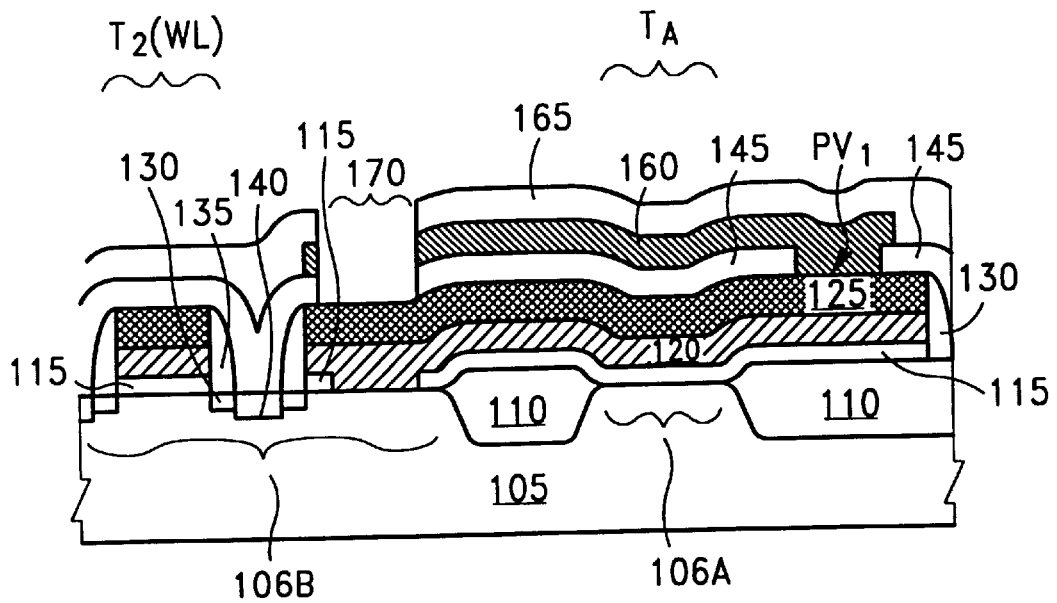
FIG. 8A and FIG. 8B are cross-sectional views along a broken line a-a' and a broken line b-b', respectively, in FIG. 3, in which the vertical poly load device area is defined in accordance with the present invention.
Figure 8B:
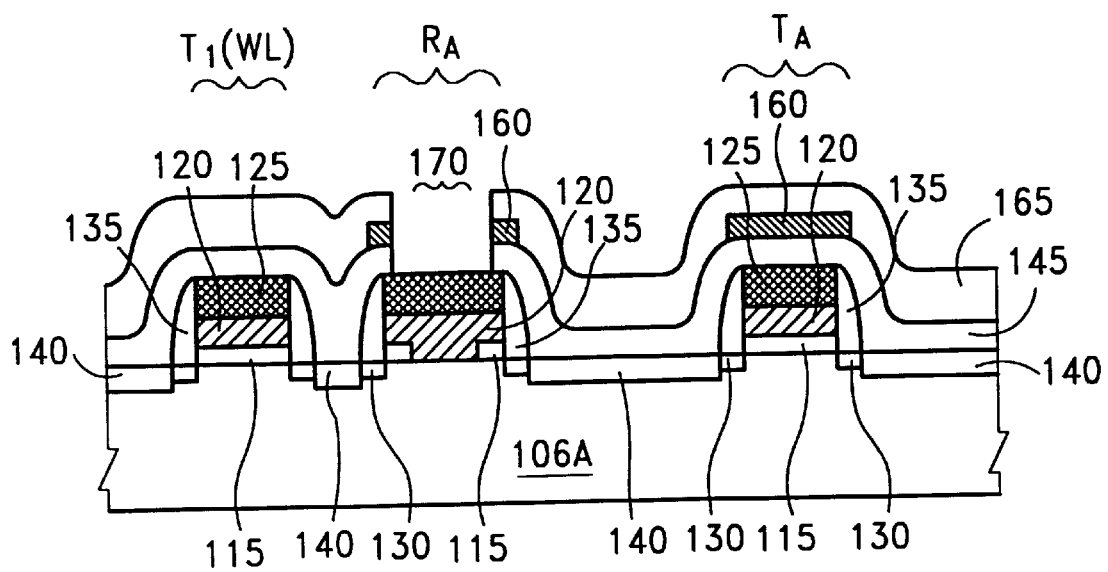

Please turn to FIGS. 8A and 8B, a photoresist pattern (not shown) with an opening aligned with the buried contact regions 117 is formed on IPD2 165 to define the poly load device area $R_B$. Then, an anisotropic etch is performed to form contact holes (or say hollows) 170 to contact buried contact regions 117 by etching away the unmask portion of the IPD2 165, through the second polysilicon layer 160, and IPD1 145, using the metal silicide 125 as an stopping layer. Then the photoresist pattern is removed. Preferably, the etching process is via three stages. They are to etch the IPD2 165 firstly, and then etch the second polysilicon layer 160, and finally etch the IPD1 145.

Figure 9A:
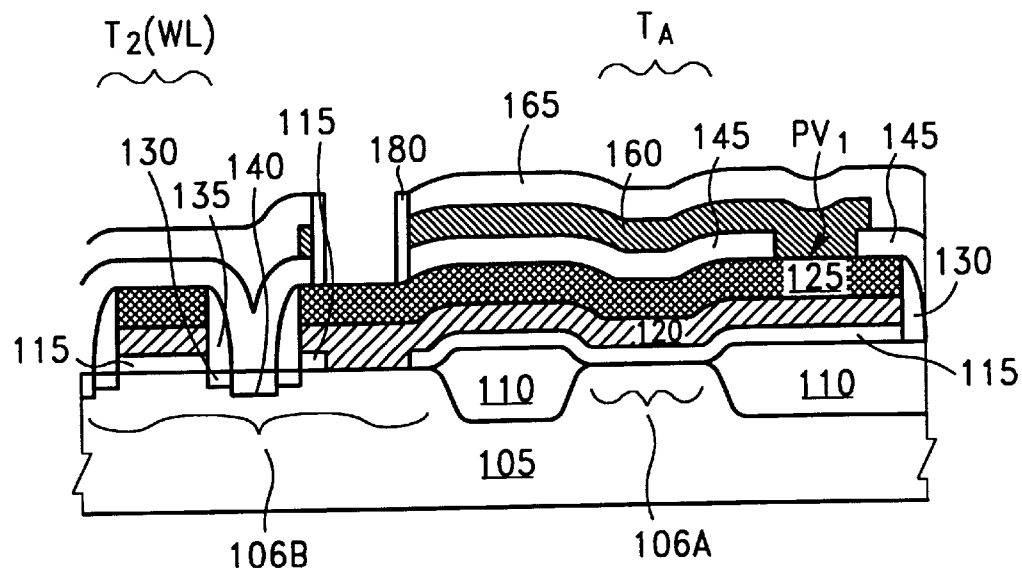
FIG. 9A and FIG. 9B are cross-sectional views along a broken line a-a' and a broken line b-b', respectively, in FIG. 3, and a broken line b-b', respectively, in FIG. 3, in which HTO oxide is formed on the sidewall of the poly load device area in accordance with the present invention.
Figure 9B:
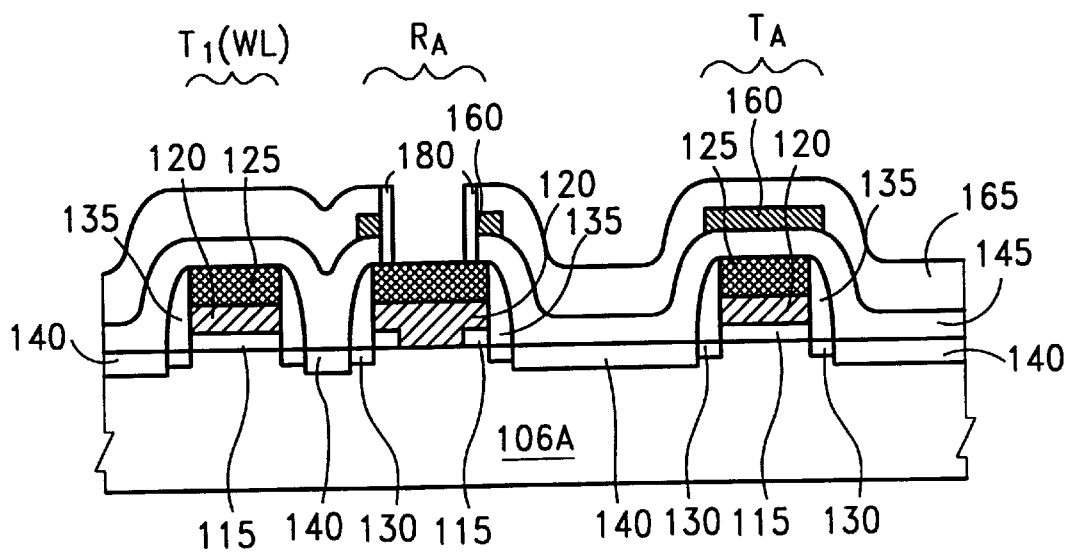

Referring to FIG. 9A and FIG. 9B, a high temperature thin oxide (HTO) is deposited by LPCVD at a temperature of between about 600–800° C. to form a conformal HTO oxide layer on the sidewall and the bottom of the hollows 170. And then an anisotropic etch is performed to form the sidewall oxide layer 180 using the tungsten silicide layer 120 as a stopping layer. The sidewall oxide layer 180 is between about 20–40 nm.

Figure 10A:
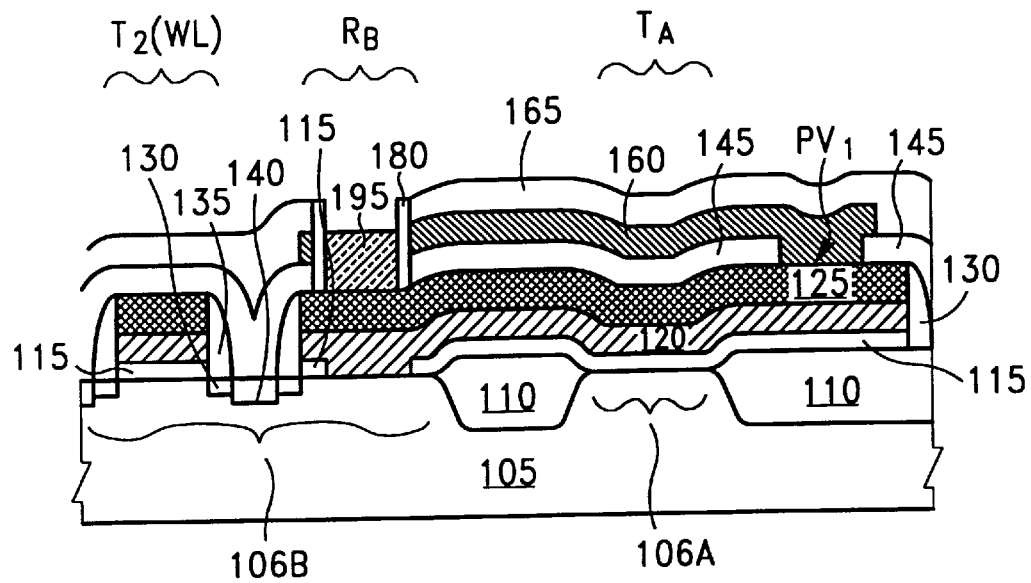
FIG. 10A and FIG. 10B are cross-sectional views along a broken line a-a' and a broken line b-b', respectively, in FIG. 3, in which a undoped polysilicon is refilled the hollow and then an etch-back and a lightly-implant with an n-type conductive impurities are performed in accordance with the present invention.
Figure 10B:
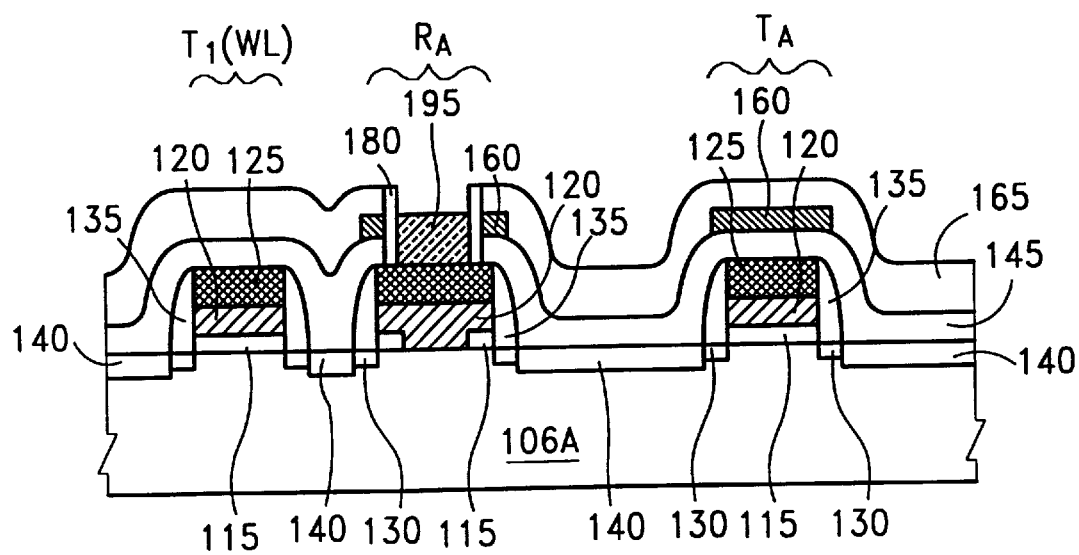

FIG. 10A and FIG. 10B shows an undoped polysilicon layer 195 is deposited by a LPCVD method to refill the hollow regions 170. Then an etched back is followed to form poly load device body $R_B$ and $R_A$. Thereafter, an ion implant using n-type conductive ions such as $P^+$ or $As^+$ is performed to form lightly doped n-type poly loads $R_B$ and $R_A$. The implant energy and dosage are between about $1\times10^{13}$–$5\times10^{15}$/cm$^2$ and 30–60 keV, respectively. The bulk resistance of the poly load device body $R_B$ and $R_A$ is about 100Ω in order of magnitude.

Figure 11A:
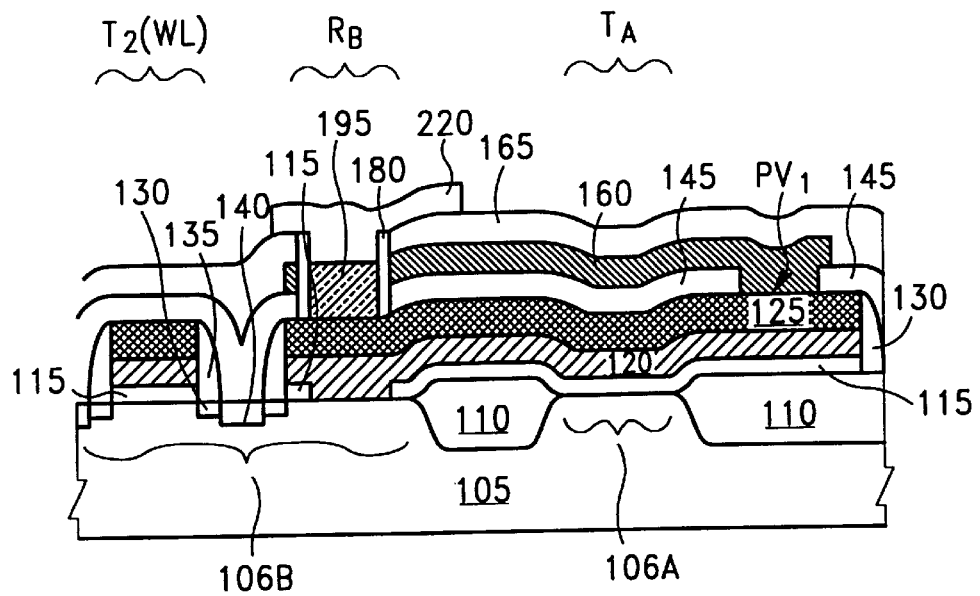
FIG. 11A and FIG. 11B are cross-sectional views along a broken line a-a' and a broken line b-b', respectively, in FIG. 3, in which a local connection line formed of a third polysilicon connect the poly load to $V_{CC}$ is formed in accordance with the present invention.
Figure 11B:
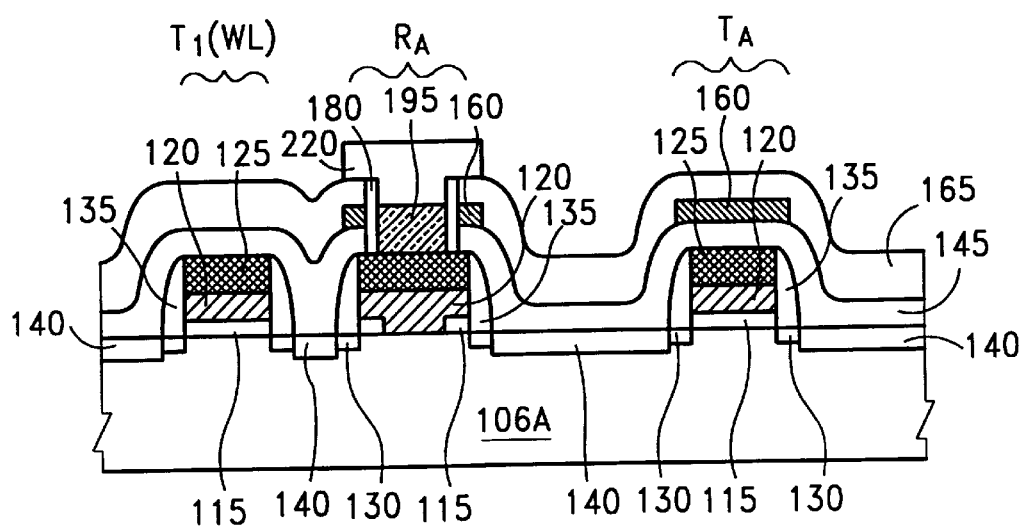

Turning to FIG. 11A and FIG. 11B, a third polysilicon layer 220 of between about 100–200 nm with n-type conductive impurities is blanket deposited to contact poly load $R_B$ and $R_A$. Then the third polysilicon layer 220 is patterned so that the connections from the poly load $R_B$ and $R_A$ to a voltage supply $V_{CC}$.

Figure 12A:
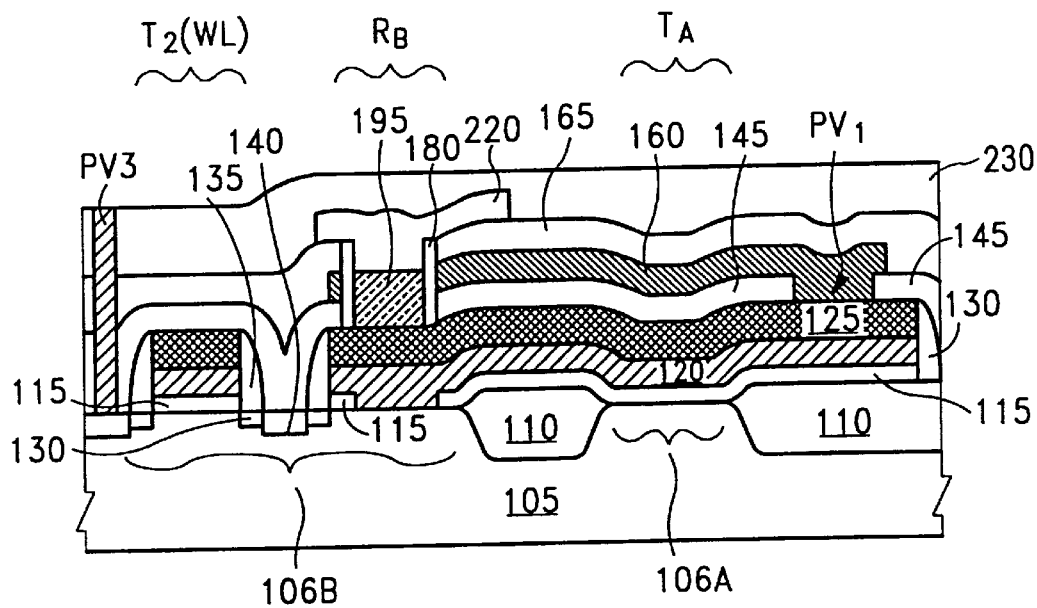
FIG. 12A and FIG. 12B are cross-sectional views along a line a-a' and a line b-b', respectively, in which a planarization ILD layer is deposited and vias are defined in accordance with the present invention.
Figure 12B:
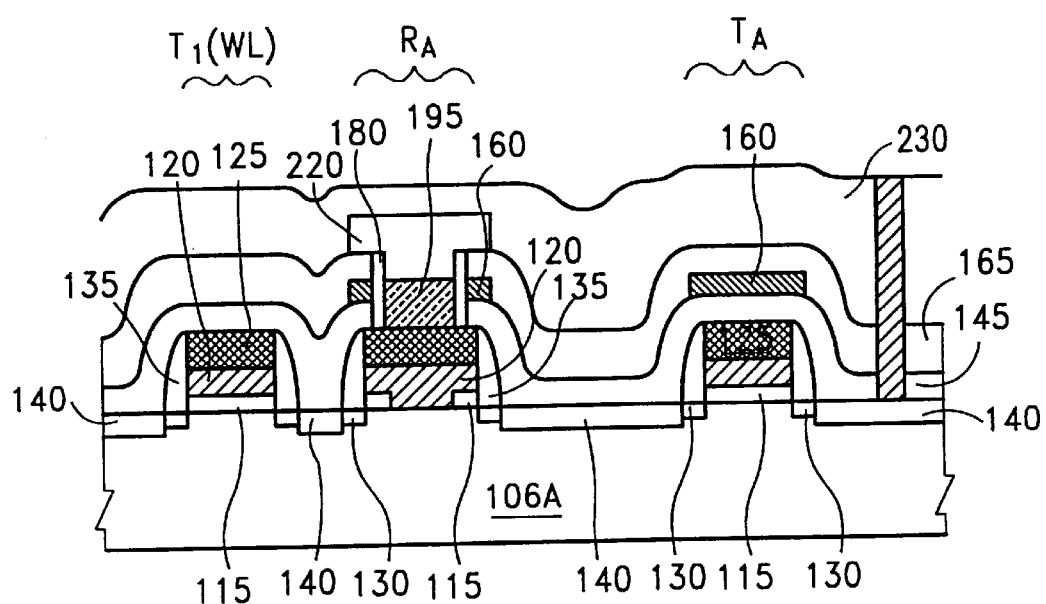

Finally, turning to 12A and 12B, an inter-level dielectric ILD 230 is deposited on all regions to form a smooth topography. Thereafter, a plurality of contact hole is defined through the processes of forming photoresist pattern (not shown) on ILD 230, and then performing anisotropic etching unmasked regions to contact source/drain region of transistor $T_B$ as shown in FIG. 12A, and contact the source of transistor $T_2$. Subsequently, after stripping the photoresist, filling the contact holes with metal, such as tungsten, and performing CMP to form vias PV2 and PV3 are performed. The via PV2 is for connecting the transistor $T_B$ to the ground $V_{SS}$.

Figure 13:
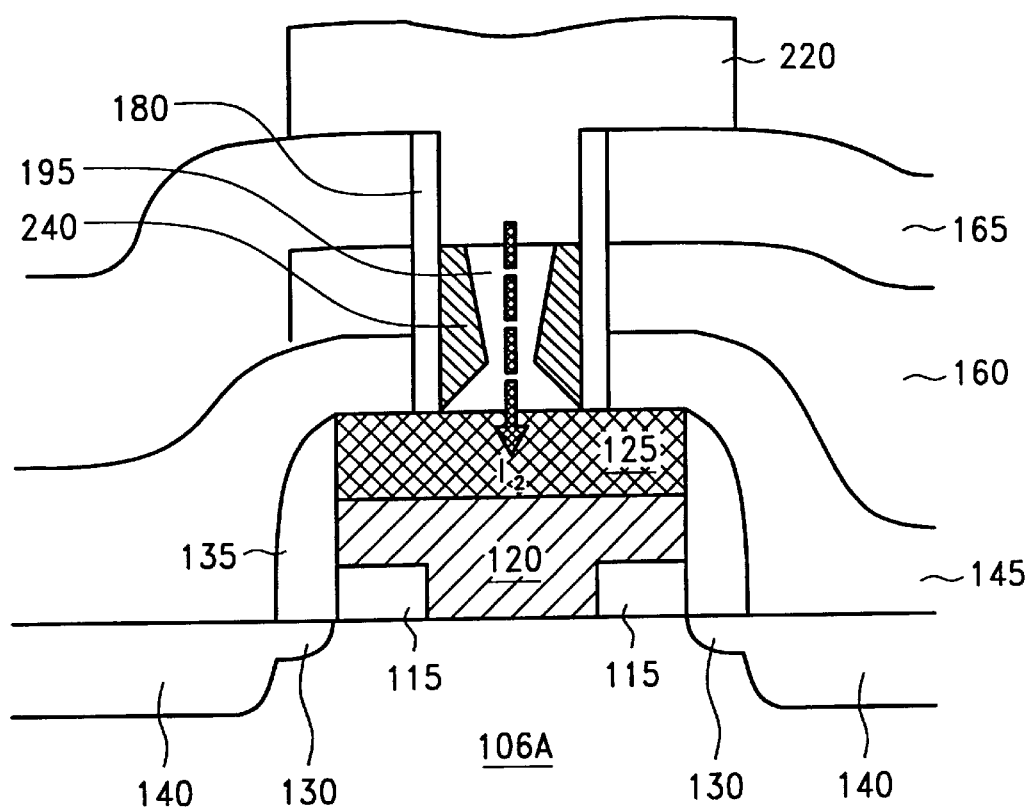
FIG. 13 is a cross-sectional view of a poly load being stressed so that the depletion region is formed in accordance with the present invention.

FIG. 13 shows the stressed poly load $R_B$, when the voltage of node N1 is high, and node N2 is low, the connection line (second polysilicon 160) provides poly load $R_B$ is with a positive bias (negative voltage), the depletion regions 240 will appear along the sidewall. The resistance of poly load $R_B$ increases and the SRAM cell will gain bigger noise margin. The arrow indicates the current $I_2$ direction.

The invention provides a method to fabricate poly load device in 4T SRAM technology and has following benefits:

(1) The novel poly load can reduce the stand-by current as comparing with the normal poly load SRAM cell.

(2) At the condition of same current consumption, the invention SRAM cell can get more process windows for the data stability.

While the preferred embodiment of the invention has been illustrated and described, it will be appreciated that various changes can be made therein without departing from the spirit and scope of the invention.

What is claimed is:

1. A SRAM cell formed on a semiconductor substrate, said semiconductor substrate having a first device region separating from a second device region by an isolation region, said SRAM cell comprising:

a first driver transistor having a gate formed of a first conductive layer and a gate oxide layer;

a first buried contact formed of said first conductive layer;

a first access transistor having a gate formed of said first conductive layer and said gate oxide layer, further, said first access transistor, said first buried contact, and said first driver transistor being formed on said first device region;

a second driver transistor having a gate formed of said first conductive layer and said gate oxide layer, said gate being extended across said isolation region to connect said first buried contact;

a second buried contact, formed of said first conductive layer, and said second buried contact being extended across said isolation to connect said gate of said first driver transistor;

a second access transistor having a gate formed of said first conductive layer and said gate oxide layer, further, said second access transistor, said second buried contact, and said second driver transistor being formed on a second device region;

a first poly load formed in a first composite layer formed of an IPD1 layer/a first connection line/an IPD2 layer, and said first poly load being with a bottom formed on said first buried contact, said IPD1 layer formed on said first conductive layer and elsewhere on said semiconductor substrate;

a second poly load formed in a second composite layer formed of said IPD1 layer/a second connection line/said IPD2 layer, and said second poly load being with a bottom formed on said second buried contact, said second poly load formed on said second buried contact, further, said first connection line through a first contact hole in said IPD1 connecting said gate electrode of said first driver transistor to said second poly load, said second connection line through a second contact hole in said IPD1 connecting said gate electrode of said second driver transistor to said first poly load;

a third connection line formed on said IPD2 so as to connect between said first poly load and a voltage supply terminal;

a forth connection line formed on said IPD2 so as to connect between said second poly load and said voltage supply terminal;

a first via through a third composite layer formed of said IPD1/said IPD2 layer connecting one of a source/drain region of said first driver transistor; and a second via through said third composite layer connecting one of a source/drain region of said second driver transistor.

2. The SRAM cell of claim 1, wherein said first conductive layer is formed of a n-type doped polysilicon layer on said gate oxide layer and a silicide layer on said polysilicon layer.

3. The SRAM cell of claim 1, wherein said first and said second connection line are formed of a n-type doped polysilicon layer having a thickness of between about 100–300 nm and 100–300 nm, respectively.

4. The SRAM cell of claim 1, wherein said first poly load is in a first hollow constructed in said first composite layer, said second poly load is in a second hollow constructed in said second composite layer, each said hollow having an oxide spacer layer formed on a sidewall, and a n-type impurities contained polysilicon layer in a remnant, so that said n-type impurities contained polysilicon layer is in a center portion of said hollow.

5. The SRAM cell of claim 4, wherein said oxide layer is about 20–40 nm in thickness.

6. The SRAM cell of claim 1, wherein said IPD1 layer is between about 100–300 nm in thickness, and is a material formed of LPCVD TEOS or $O_3$ TEOS oxide layer.

7. The SRAM cell of claim 1, wherein said IPD2 layer is between about 100–300 nm nm in thickness, and is a material formed of LPCVD TEOS or $O_3$ TEOS oxide layer.

* * * * *